United States Patent
Tsau

(10) Patent No.: US 9,859,318 B2
(45) Date of Patent: Jan. 2, 2018

(54) COLOR AND INFRARED IMAGE SENSOR WITH DEPLETION ADJUSTMENT LAYER

(71) Applicant: OmniVision Technologies, Inc., Santa Clara, CA (US)

(72) Inventor: Guannho George Tsau, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 578 days.

(21) Appl. No.: 14/521,093

(22) Filed: Oct. 22, 2014

(65) Prior Publication Data

US 2016/0118428 A1 Apr. 28, 2016

(51) Int. Cl.
*H01L 27/146* (2006.01)

(52) U.S. Cl.
CPC .... *H01L 27/14621* (2013.01); *H01L 27/1464* (2013.01); *H01L 27/14616* (2013.01); *H01L 27/14643* (2013.01); *H01L 27/14645* (2013.01); *H01L 27/14649* (2013.01)

(58) Field of Classification Search
CPC ......... H01L 27/14621; H01L 27/14616; H01L 27/14649; H01L 27/14645; H01L 27/1464; H01L 27/14643
See application file for complete search history.

(56) References Cited

U.S. PATENT DOCUMENTS

| | | | |
|---|---|---|---|
| 7,205,627 B2 * | 4/2007 | Adkisson | H01L 27/14609 250/208.1 |
| 2005/0133690 A1 * | 6/2005 | Higashitsutsumi | H01L 27/14621 250/208.1 |
| 2010/0019294 A1 * | 1/2010 | Velichko | H01L 27/14689 257/292 |
| 2011/0140177 A1 * | 6/2011 | Yamashita | H01L 27/14603 257/222 |
| 2013/0056807 A1 * | 3/2013 | Kobayashi | H01L 31/03529 257/290 |
| 2013/0161613 A1 * | 6/2013 | Nakamura | H01L 31/0256 257/43 |
| 2014/0246748 A1 | 9/2014 | Hynecek | |

FOREIGN PATENT DOCUMENTS

EP 1667232 B1 1/2011

OTHER PUBLICATIONS

TW Patent Application No. 104134574—Taiwanese Office Action and Search Report, dated Dec. 27, 2016, with English Translation, 6 pages.

* cited by examiner

*Primary Examiner* — Georgia Y Epps
*Assistant Examiner* — Don Williams
(74) *Attorney, Agent, or Firm* — Christensen O'Connor Johnson Kindness PLLC

(57) ABSTRACT

An image sensor pixel includes a photodiode region formed in a semiconductor layer, a pinning layer and a depletion adjustment layer. The photodiode region receives visible and infrared light from a light incident side of the image sensor pixel. The pinning layer is disposed between a front surface of the semiconductor layer and the photodiode region, while the depletion adjustment layer is disposed between the pinning layer and the photodiode region. The depletion adjustment layer is configured to adjust a depletion region of the photodiode region to reduce charge carriers induced in the photodiode region by the received infrared light.

27 Claims, 23 Drawing Sheets

| B | G | B | G | B | G | B | G |
|---|---|---|---|---|---|---|---|
| C' | R | C' | R | C' | R | C' | R |
| B | G | B | G | B | G | B | G |
| C' | R | C' | R | C' | R | C' | R |
| B | G | B | G | B | G | B | G |
| C' | R | C' | R | C' | R | C' | R |
| B | G | B | G | B | G | B | G |
| C' | R | C' | R | C' | R | C' | R |

| B | G | R | G | R | G | B | G |
|---|---|---|---|---|---|---|---|
| G | C' | G | B | G | B | G | C' |
| R | G | C' | G | C' | G | R | G |
| C | B | G | R | G | R | C | B |
| R | G | C' | G | C' | G | R | G |
| C | B | G | R | G | R | C | B |
| B | G | R | G | R | G | B | G |
| G | C' | G | C' | G | C' | G | C' |

FIG. 7A

| B | G | C' | G | C' | G | R | G |
|---|---|----|---|----|---|---|---|
| G | R | G | C' | G | C' | G | B |
| C' | G | B | G | R | G | C' | G |
| G | C' | G | R | C | B | G | C' |
| C' | G | R | C | B | G | C' | G |
| G | C' | G | B | G | R | G | C' |
| R | G | C' | G | C' | G | B | G |
| G | B | G | C' | G | C' | G | R |

FIG. 7B

| B | G | C' | G | C' | G | R | G |
|---|---|----|---|----|---|---|---|
| G | B | G | C' | G | C' | G | R |
| C' | G | R | G | B | G | C' | G |
| G | C' | G | R | C | B | G | C' |
| C' | G | B | C | R | G | C' | G |
| G | C' | G | B | G | R | G | C' |
| R | G | C' | G | C' | G | B | G |
| G | R | G | C' | G | C' | G | B |

| B | C | G | C | G | C | R | C |
|---|---|---|---|---|---|---|---|
| C' | B | C' | G | C' | G | C' | R |
| G | C | R | C | B | C | G | C |
| C' | G | C' | R | C' | B | C' | G |
| G | C | B | C | R | C | G | C |
| C' | G | C' | B | C' | R | C' | G |
| R | C | G | C | G | C | B | C |
| C' | R | C' | G | C' | G | C' | B |

FIG. 7F

| B | G | R | G | R | G | B | G |
|---|---|---|---|---|---|---|---|
| G | C' | G | B | G | B | G | C' |
| R | G | C' | G | C' | G | R | G |
| G | B | G | R | G | R | G | B |
| R | G | C' | G | C' | G | R | G |
| G | B | G | R | G | R | G | B |
| B | G | R | G | R | G | B | G |
| G | C' | G | B | G | B | G | C' |

COLOR AND INFRARED IMAGE SENSOR WITH DEPLETION ADJUSTMENT LAYER

TECHNICAL FIELD

This disclosure relates generally to image sensors, and in particular but not exclusively, relates to CMOS image sensors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture cost effective yet high performance image sensors on silicon substrates. A large number of image sensors have the capability to sense both visible and near infrared (NIR) light. One application of such a sensor may be when used in an automotive sensor for driver assistance applications and safety applications, such as pedestrian, obstruction and sign detection, rear-view or back-up camera applications, etc. Such sensors can operate in a dual mode, which allows them to function both in daylight (in the visible light spectrum application) and night vision (in the IR application). This incorporated IR capability is made possible by the development and implementation of a number of process-level enhancements that expand the sensor's spectral light sensitivity to within the NIR range of 750-1400 nm.

For example, a typical image sensor that senses both visible light and IR light may include individual image sensor pixels, that are each configured to sense either visible or IR light. Those image sensor pixels that are configured to sense IR light typically include an IR pass filter to block light in the visible range and to only allow IR or NIR light to reach that pixel's photosensitive region (e.g., photodiode region). In some applications an IR pass filter is formed by stacking multiple color filters on top of each other (e.g., blue (B) and red (R)). Similarly, the image sensor pixels that are configured to sense the visible light typically include an IR cut filter that blocks IR or NIR light such that only visible light of a particular frequency range (e.g., Red (R), Green (G), or Blue (B)) reaches that pixel's photosensitive region. However, the addition of IR cut filters and IR pass filters adds to the material costs, as well as the process costs of fabricating an IR/Visible image sensor on the very same silicon chip.

BRIEF DESCRIPTION OF THE DRAWINGS

Exemplary embodiments are described with reference to the following figures, wherein like reference numerals refer to like parts throughout the various views unless otherwise specified.

FIGS. 5A-5D are diagrams of example repeating patterns that include a four (4) by four (4) arrangement of image sensor pixels, in accordance with embodiments of the present disclosure.

FIGS. 6A-8F are diagrams of example repeating patterns that include an eight (8) by eight (8) arrangement of image sensor pixels, in accordance with embodiments of the present disclosure.

FIGS. 9A and 9B are diagrams of example repeating patterns that include a four (4) by four (4) arrangement of image sensor pixels, in accordance with embodiments of the present disclosure.

DETAILED DESCRIPTION

Figure 1:
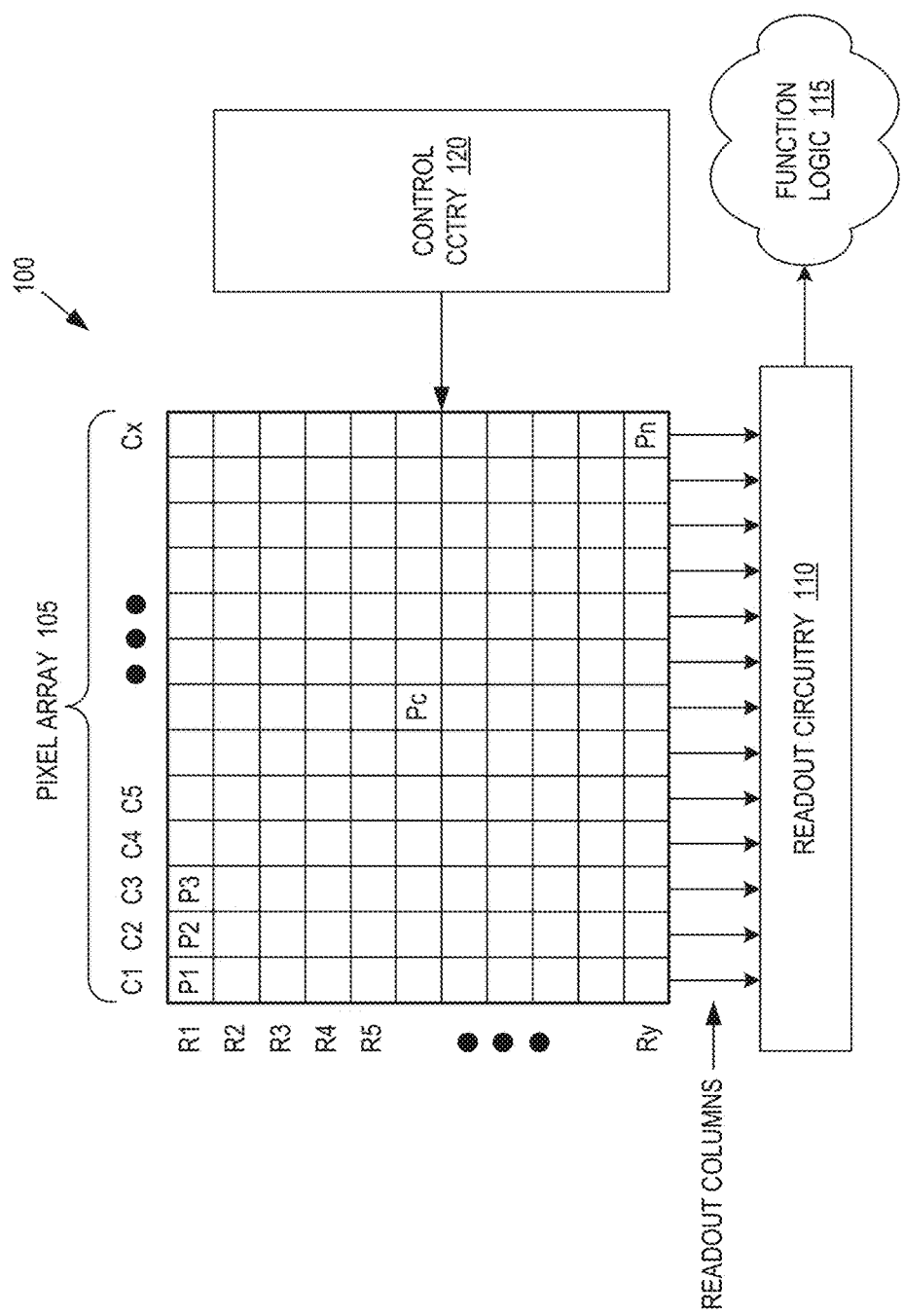
FIG. 1 is a block diagram illustrating an imaging system, in accordance with an embodiment of the present disclosure.

Embodiments of an image sensor pixel, an image sensor, an imaging system having a depletion adjustment layer in at least some of the image sensor pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. For example, although not illustrated, it should be appreciated that image sensor pixels may include a number of conventional layers (e.g., antireflective films, etc.) used for fabricating CIS pixels. Furthermore, the illustrated cross sections of image sensor pixels illustrated herein do not necessarily illustrate all the pixel circuitry associated with each pixel. However, it should be appreciated that each pixel may include pixel circuitry coupled to its collection region for performing a variety of functions, such as commencing image acquisition, resetting accumulated image charge, transferring out acquired image data, or otherwise.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As mentioned above, the addition of IR cut filters and IR pass filters in conventional IR/Visible image sensors adds to the costs of fabrication. Accordingly, embodiments of the present disclosure provide an image sensor that is capable of detecting IR and Visible light without the need of the previously mentioned IR cut filters and IR pass filters. As will be discussed in more detail below, some image sensor pixels of an image sensor according to aspects of the present invention, include a depletion adjustment layer to reduce, or even prevent, the inducement of charge carriers (i.e., holes and electrons) by the IR light received in the photodiode region.

In some aspects, an image sensor includes "clear" image sensor pixels. A clear image sensor pixel may be one that includes a clear filter that is substantially colorless and/or optically transparent over a range of wavelengths that includes at least the range of wavelengths of the other filters in the arrangement. For example, a clear filter of a clear image sensor pixel may be optically transparent to visible light including Red (R), Green (G), and Blue (B) light, as well as infrared (IR) or near infrared (NIR) light, such that both the visible and IR light are received by the photodiode region of the clear image sensor pixel. Embodiments discussed herein may provide an image sensor that includes both clear (C) image sensor pixels, as well as modified clear (C') image sensor pixels. The modified clear (C') image sensor pixels may include the same clear filter as included in the clear (C) image sensor pixel, but the modified clear (C') image sensor pixel includes the addition of the depletion adjustment layer, while the clear (C) image sensor pixel does not include a depletion adjustment layer. Thus, both the modified clear (C') and the clear (C) image sensor pixels include photodiode regions that receive both IR and visible light, but the addition of the depletion adjustment layer in the modified clear (C') image sensor pixel prevents IR-generated charge carriers in that pixel.

Accordingly, some embodiments provided herein may obtain an IR signal value by finding the signal difference between a clear (C) image sensor pixel and a modified clear (C') image sensor pixel as follows:

$$IR = C - C' \qquad \text{EQ. 1}$$

FIG. 1 is a block diagram illustrating an imaging system 100, in accordance with an embodiment of the present disclosure. The illustrated embodiment of imaging system 100 includes pixel array 105 having one or more of the aforementioned improved characteristics, readout circuitry 110, function logic 115, and control circuitry 120. Pixel array 105 is a two-dimensional ("2D") array of image sensor pixels (e.g., pixels P1, P2 ..., Pn). In one embodiment, each pixel is implemented using one or more of the below described pixels 200A, 200B, and 302A-E of FIGS. 2A-3. Furthermore, the pixels of array 105 may be arranged in the array according to a repeating pattern, such as a color filter array (CFA) pattern. The arrangement of the pixels according to a color filter array (CFA) pattern may produce better low light and/or better color aliasing performance. Discussion of several example CFA patterns will commence below with reference to FIGS. 4-9B.

Continuing with the example image sensor of FIG. 1, each pixel included in array 105 may be a complementary metal oxide semiconductor (CMOS) image sensor (CIS) pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital ("ADC") conversion circuitry, or otherwise. Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a column/row readout, a serial readout, or a full parallel readout of all pixels simultaneously. Control circuitry 120 is connected with pixel array 105 to control operational characteristic of pixel array 105. For example, control circuitry 120 may generate a shutter signal for controlling image acquisition.

Figure 2A:
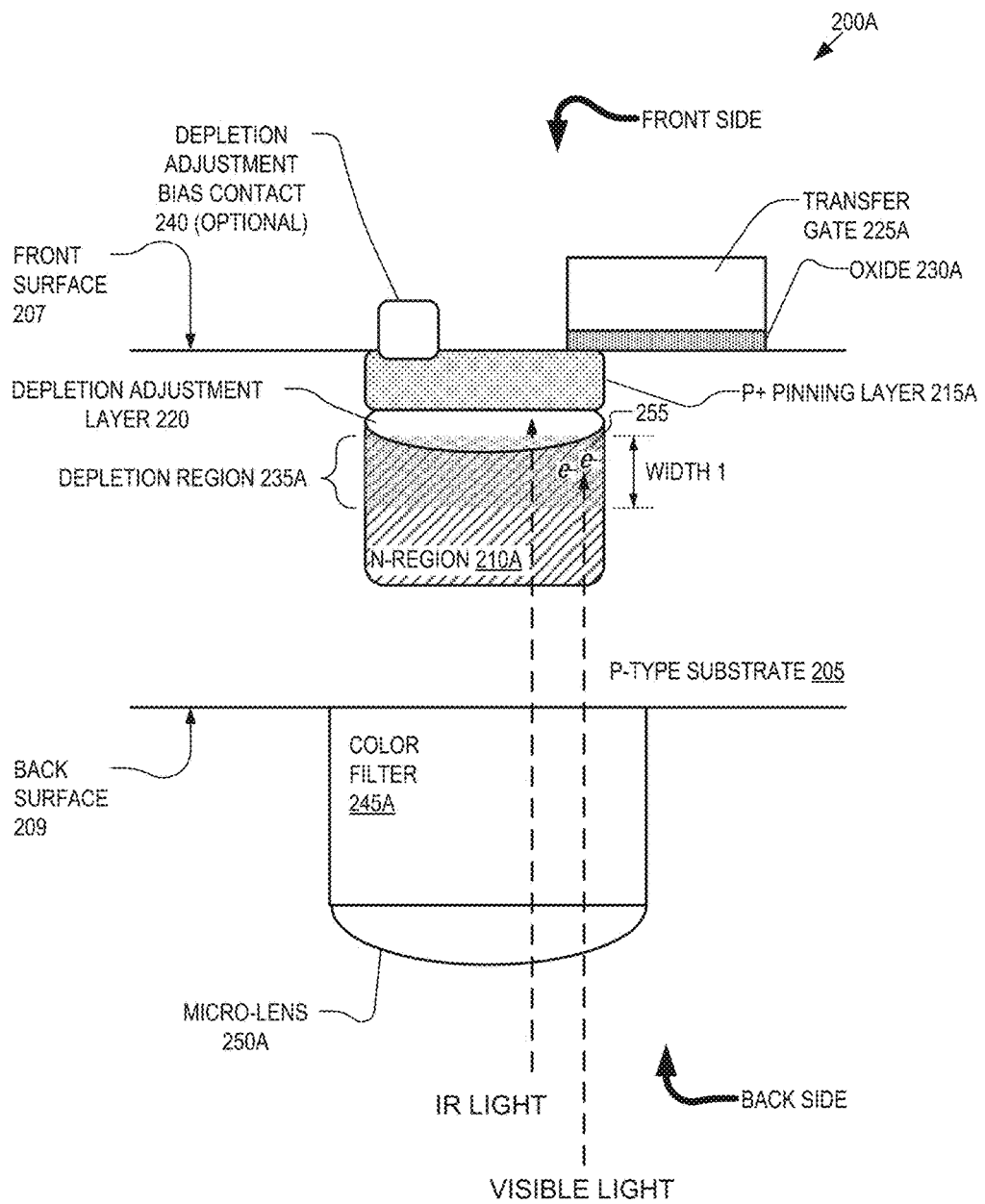
FIG. 2A is a cross-sectional view of an image sensor pixel including a depletion adjustment layer, in accordance with an embodiment of the present disclosure.

FIG. 2A is a cross-sectional view of an image sensor pixel 200A including a depletion adjustment layer 220, in accordance with an embodiment of the present disclosure. Image sensor pixel 200A is one possible implementation of at least some of the pixels of pixel array 105 of FIG. 1. Pixel 200A is shown in FIG. 2A as including a semiconductor layer (i.e., p-type substrate 205), a photodiode region (i.e., n-region 210A), a P+ pinning layer 215A, depletion adjustment layer 220, transfer gate 225A, oxide 230A, color filter 245A, and a micro-lens 250A. Image sensor pixel 200A may be referred to as a pinned photodiode structure because of P+ pinning layer 215A. A pinned photodiode structure may be used because of its low-noise performance. In these pinned photodiode structures, P+ type doped pinning layer 215A is implanted at or just below the front surface 207 of substrate 205 and adjacent to transfer gate 225A. The N-type photodiode region 210A is implanted deeper into the P-type doped silicon substrate 205, also adjacent to the transfer gate 225. The N-type doped photodiode region 210A is a buried layer that stores charge away from the surface region where defects typically reside. The purpose of the P+ type pinning layer 215A is to passivate the defects on the photodiode surface.

As shown in FIG. 2A, depletion adjustment layer 220 is disposed between the pinning layer 215A and the photodiode region 210A. In one embodiment, depletion adjustment layer 220 is in direct contact with both the pinning layer 215A and the photodiode region 205. That is, in one embodiment, no additional implants or other structured intervene between the pinning layer 215 and depletion adjustment layer 220 as well as between depletion adjustment layer 220 and photodiode region 210A. In one embodiment, depletion adjustment layer 220 is an additional P+ type implant into substrate 205. Depletion adjustment layer 220 is separate and distinct from p+ pinning layer 215A where both are formed by separate implants. In one example, depletion adjustment layer 220 is an implant of Boron at a concentration of $10^{15}$ cm$^2$.

Depletion adjustment layer 220 is disposed within the substrate layer 205 to adjust a depletion region 235A of photodiode region 210A. Depletion region 235A is an insulating region within a conductive, doped semiconductor material where the mobile charge carriers have diffused away, or have been forced away by an electric field. In operation, the depletion region 235A is free of all doped charge carriers, leaving substantially none to recombine with those light generated free charge carriers. In one embodiment, depletion adjustment layer 220 is configured to decrease a width (i.e., WIDTH 1) of the depletion region 235A. The width of the depletion region 235A is the distance between the top and bottom of the depletion region. In addition to decreasing the width of the depletion region 235A, depletion adjustment layer 220 may also increase a distance between front surface 207 and the top of depletion region 235A.

Also shown if FIG. 2A, is an optional depletion adjustment bias contact 240. Bias contact 240 is formed on the front surface 207 of substrate 205 and is electrically coupled to pinning layer 215A. In operation bias contact 240 may apply a bias voltage to further adjust (i.e., move and/or decrease width) the depletion region 235A.

In operation, photodiode region 210A of image sensor pixel 200A receives both IR and visible light. Thus, in one embodiment image sensor pixel 200A does not include any filters to restrict the IR light received by photodiode region 210A. However, the addition of depletion adjustment layer 220 has adjusted the depletion region 235A such that the IR light is prevented from inducing charge carriers in photodiode region 210A, because the IR light penetrates to, and is primarily absorbed in the depletion adjustment layer 220, as indicated by the IR light arrow; at this location, any charge carrier induced by the IR light is quickly recombined due to the doped nature of the depletion adjustment layer 220. In contrast, visible light penetrates to, and is primarily absorbed in the depletion region 235A; at this location; charge carriers 255 induced by the visible light are not recombined. In one embodiment, IR light requires a minimum width of the depletion region in order to induce charge carriers in the photodiode region. Thus, depletion adjustment layer 220 may be configured to reduce the width of depletion region 235A to be less than the minimum width needed for IR carrier inducement.

As is further shown in FIG. 2A, image sensor pixel 200A includes a color filter 245A disposed on a light incident side (e.g., backside) of the image sensor. In one embodiment color filter 245A is blocks substantially all visible light except for that of a designated frequency range. For example, color filter 245A may be a Blue (B) color filter that blocks out most other visible light except for light if the blue frequency range. Similarly, color filter 245A may be a Red (R), Green (G), Cyan, Magenta, or Yellow color filter. In another embodiment, color filter 245A may be a clear color filter that is substantially colorless and/or optically transparent over a range of wavelengths that includes at least the range of wavelengths of the other filters in the arrangement. Color filter 245A is also optically transparent to IR or NIR to allow IR light to pass through to photodiode region 210A. FIG. 2A further shows micro-lens 250A coupled to a light incident side of color filter 245A for focusing incident light onto photodiode region 210A.

As used herein a "modified" image sensor pixel is one that includes a depletion adjustment layer, such as depletion adjustment layer 220. Thus, a modified blue image sensor pixel is a pixel such as pixel 200A that includes a blue color filter 245A. Similarly, a modified Red (R), Green (G), and Clear (C') image sensor pixel all refer to an image sensor pixel that includes depletion adjustment layer 220. An unmodified clear image sensor pixel, or just a clear (C) image sensor pixel may refer to an image sensor pixel that does not include depletion adjustment layer 220.

Figure 2B:
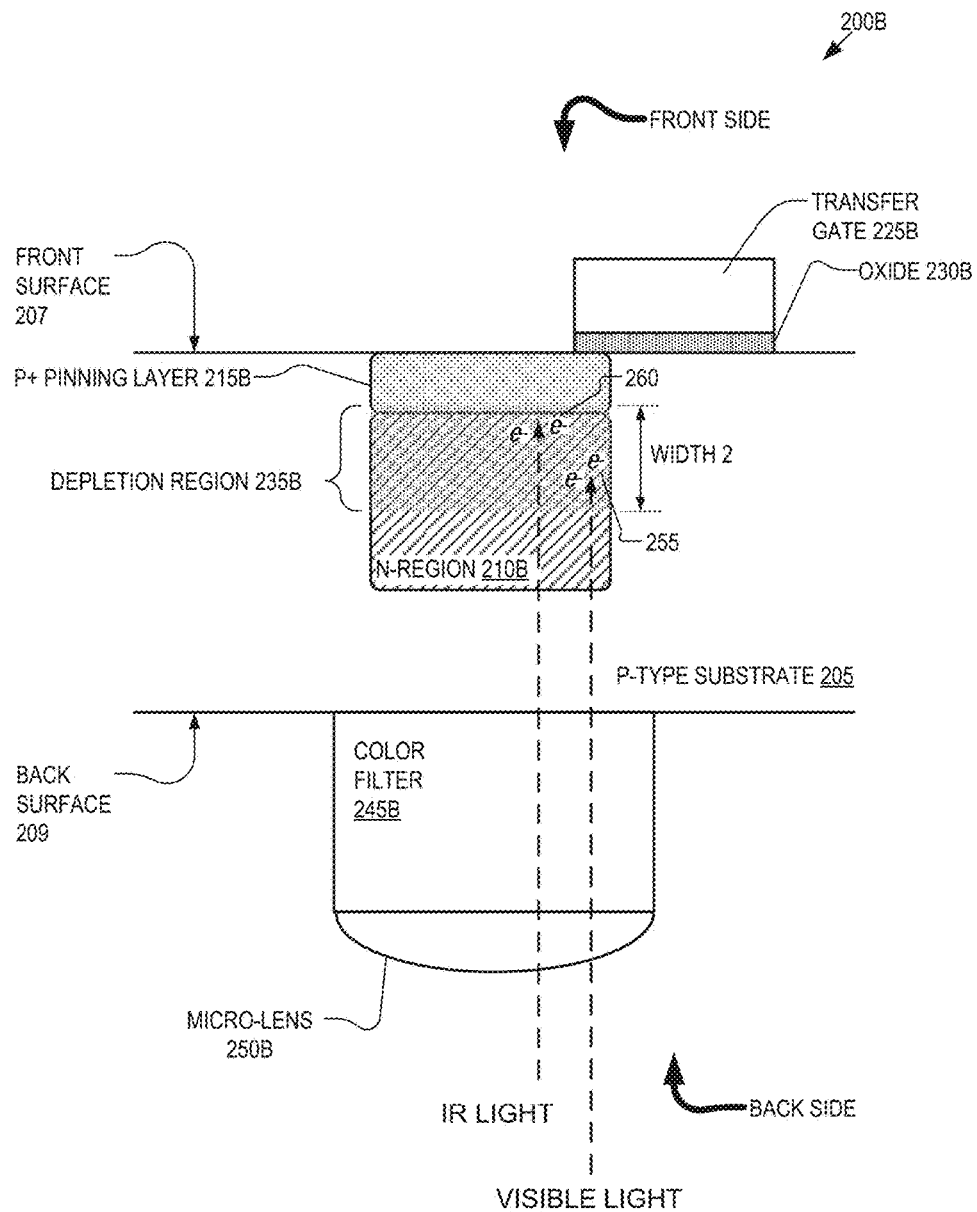
FIG. 2B is a cross-sectional view of an image sensor pixel that does not include a depletion adjustment layer, in accordance with an embodiment of the present disclosure.

For example, FIG. 2B is a cross-sectional view of an unmodified image sensor pixel 200B that does not include a depletion adjustment layer, in accordance with an embodiment of the present disclosure. Image sensor pixel 200B is one possible implementation of at least some of the pixels of pixel array 105 of FIG. 1. Pixel 200B is shown in FIG. 2B as including a semiconductor layer (i.e., p-type substrate 205), a photodiode region (i.e., n-region 210B), a P+ pinning layer 215b, transfer gate 225B, oxide 230B, color filter 245B, and a micro-lens 250B. P+ type doped pinning layer 215B is implanted at or just below the front surface 207 of substrate 205 and adjacent to transfer gate 225B. The N-type photodiode region 210B is implanted deeper into the P-type doped silicon substrate 205, also adjacent to the transfer gate 225B. The N-type doped photodiode region 210B is a buried layer that stores charge away from the surface region where defects typically reside. The purpose of the P+ type pinning layer 215B is to passivate the defects on the photodiode surface.

As shown in FIG. 2B, image sensor pixel 200B does not include a depletion adjustment layer (e.g., layer 220 of FIG. 2A). Thus, in one embodiment, photodiode region 210B is in direct contact with the pinning layer 215B. That is, in one embodiment, no additional implants or other structured intervene between the pinning layer 215B and photodiode region 210B. The absence of the depletion adjustment layer results in a depletion region 235B that allows both IR light and visible light to penetrate to and be absorbed in the depletion region 235B, and induce charge carriers 260 and 255, respectively, in the photodiode region 210B. In other words, the absence of the depletion adjustment layer means that charge carriers induced in the photodiode region 210B by the received IR light are not prevented, nor reduced, as compared to the image sensor pixel 210A of FIG. 2A. As shown in FIG. 2B, depletion region 235B has a width (i.e., WIDTH 2) that is greater than the width (i.e., WIDTH 1) of image sensor pixels that include a depletion adjustment layer. In one embodiment, the width of depletion region 235B is equal to or greater than the minimum width necessary for IR light to induce charge carriers in photodiode region 210B.

Figure 3:
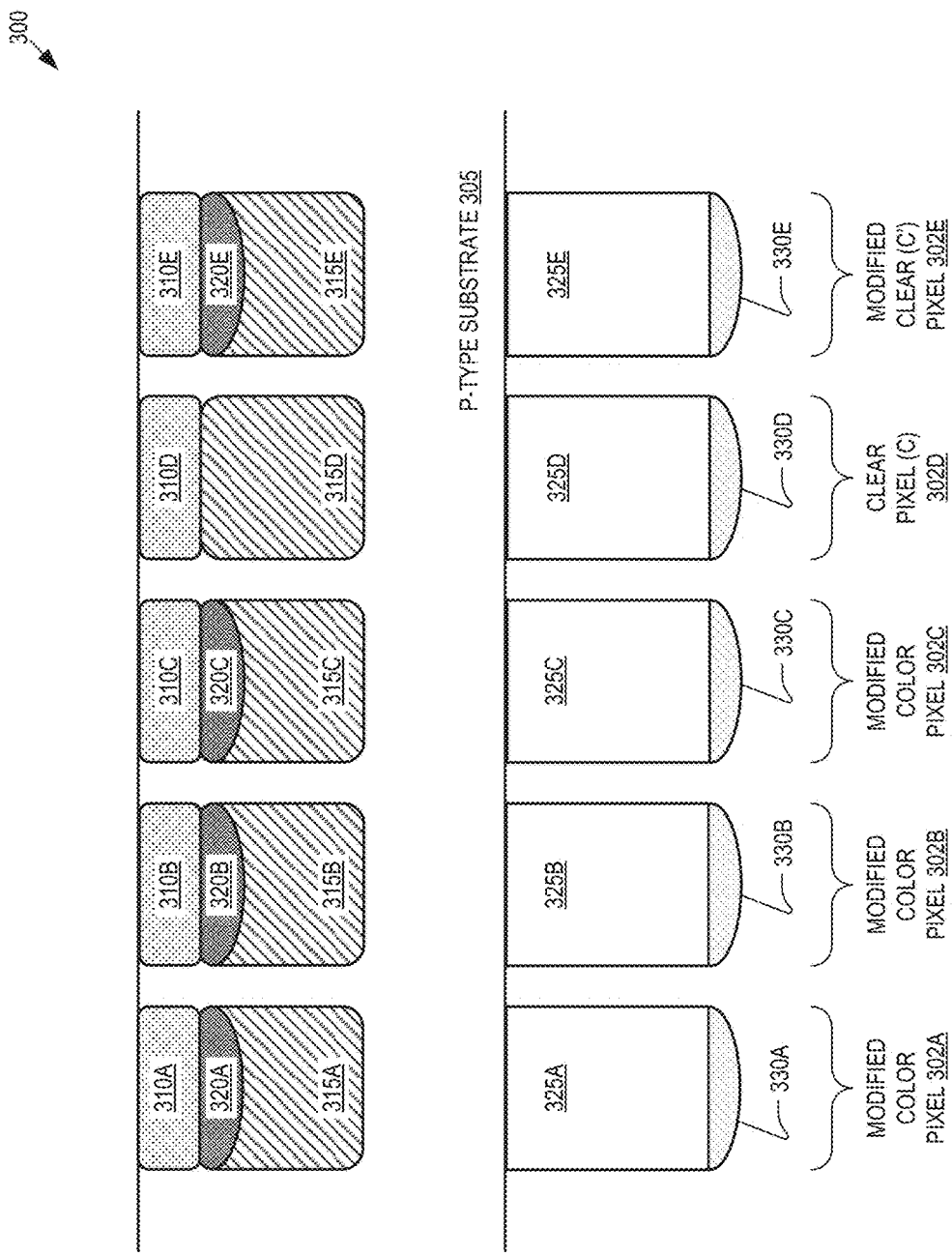
FIG. 3 is a cross-sectional view of an image sensor that includes modified color pixels, a modified clear pixel, and a clear pixel, in accordance with an embodiment of the present disclosure.

FIG. 3 is a cross-sectional view of an image sensor 300 that includes modified color image sensor pixels (302A-C), a modified clear image sensor pixel (302E), and a clear image sensor pixel (302D), in accordance with an embodiment of the present disclosure. Image sensor 300 is one possible implementation of at least some of the pixels included in pixel array 105 of FIG. 1. Each of the illustrated image sensor pixels of FIG. 3 are shown as including a pinning layer (310A-E), a photodiode region (315A-E), a color filter (325A-E), and a micro-lens (330A-E). Also, all but clear image sensor pixel 302D are shown as including a depletion adjustment layer 320A, 320B, 320C, and 320E. In one embodiment, modified image sensor pixel 302A is a modified red (R) pixel including a red color filter 325A. Similarly, pixel 302B may be a Green (G) pixel including a green color filter 325B, while pixel 302C may be a Blue (B) pixel including a blue color filter 325C. Both color filters 325D and 325E may be clear filters configured to pass through at least light of the other three pixel types (i.e., R, G, and B). In addition, each of the color filter 325A-325E allow IR or NIR light to pass through to their respective photodiode regions. However, as discussed above the addition of depletion adjustment layers prevents, or at least, reduces IR photo generated carriers in the corresponding photodiode regions. Thus, a modified Red image sensor pixel (e.g., 302A) may collect only red light photo-generated charge carriers (i.e., not IR photo-generated charge carriers. Similarly, a modified Green image sensor pixel (e.g., 302B) may collect only green light photo-generated charge carriers, while a modified Blue image sensor pixel (e.g., 302C) may collect only blue light photo-generated charge carriers. Also, the modified clear pixel 302E may collect Red, Green, and Blue light photo-generated charge carriers and not IR photo-generated carriers. However, unmodified clear pixel 302 does not include a depletion adjustment layer and thus may collect both RGB photo-generated charge carriers, as well as IR photo-generated carriers.

The IR signal value of image sensor 300 may be obtained by way of Equation 1, above. For example, the difference in signal value between clear pixel 302D and modified clear pixel 302E may be taken as an IR signal value. In one embodiment, readout circuitry (e.g., readout circuitry 110 of FIG. 1) includes analog circuitry (e.g., differential amplifier) for obtaining the difference between the pixel signals readout from the clear and modified clear pixels. In another embodiment, the readout circuitry includes digital circuitry (e.g., analog-to-digital ADC, and arithmetic operators) for obtaining an IR signal value after the pixel signals have been digitized.

FIG. 3 illustrates three modified color pixels (302A-C), a single clear pixel 302D, and a single modified clear pixel 302E. However, implementations of an image sensor according to aspects discussed herein may include hundreds, if not thousands of pixels arranged in an array. Furthermore, the pixels of the array may be arranged in the array according to a repeating pattern, such as a color filter array (CFA) pattern. The arrangement of the pixels according to a color filter array (CFA) pattern may produce better low light and/or better color aliasing performance.

Figure 4:
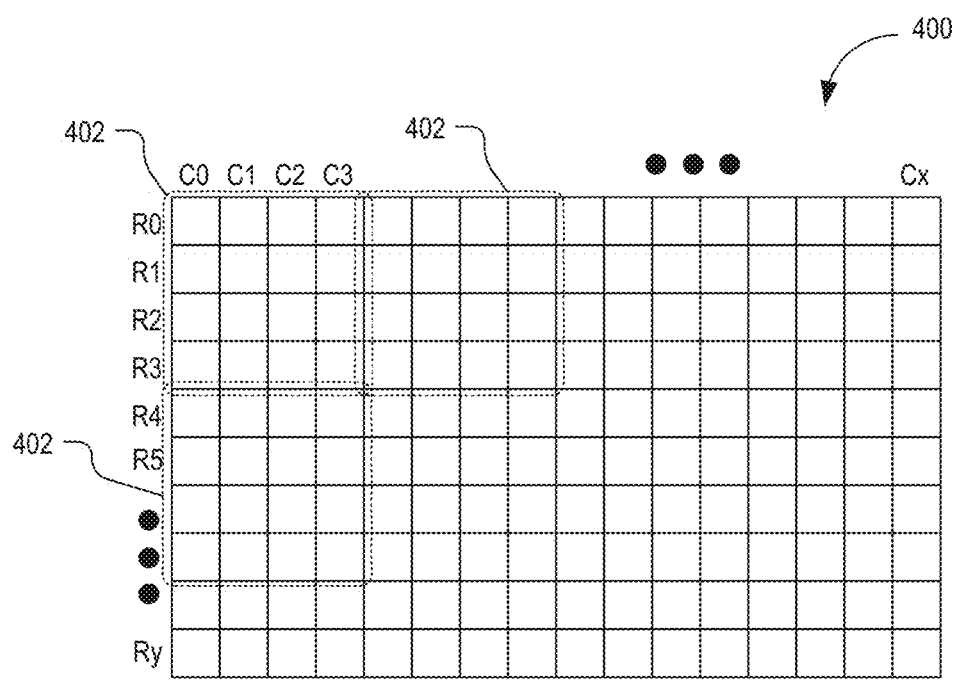
FIG. 4 illustrates an array of image sensor pixels arranged in the array according to a repeating pattern, in accordance with an embodiment of the present disclosure.

FIG. 4 illustrates an array 400 of image sensor pixels arranged in the array according to a repeating pattern 402, in accordance with an embodiment of the present disclosure. Array 400 is one possible implementation of array 105 of FIG. 1. As shown, the pixels of array 400 are disposed in the array into rows (e.g., rows R1 to Ry) and columns (e.g., column C1 to Cx). Repeating pattern 402 is applied to all pixels in the array and dictates not only the type of color filter (e.g., red, green, blue, or clear), but also whether the pixel is a modified pixel (i.e., includes a depletion adjustment layer) or unmodified (i.e., does not include a depletion adjustment layer). Although FIG. 4 illustrates repeating pattern as a four by four pattern of pixels, other patterns may include an eight by eight pattern, as well. Several example CFA patterns are discussed below with reference to FIGS. 5A-9B. For ease of explanation, all color pixels (i.e., Red (R), Green (G), and Blue (B)) referred to in FIGS. 5A-9B are modified image sensor pixels and thus each include the aforementioned depletion adjustment layer. Embodiments of the present disclosure may be applied to any known color filter pattern that includes color and clear image sensor pixels by replacing all the color pixels with modified color pixels (i.e., add a depletion adjustment layer) and by replacing some of the clear image sensor pixels with modified clear image sensor pixels. Accordingly, discussion below will focus on the arrangement of the clear and modified clear image sensor pixels in the pattern.

Figures 5A, 5B, 5C, 5D:
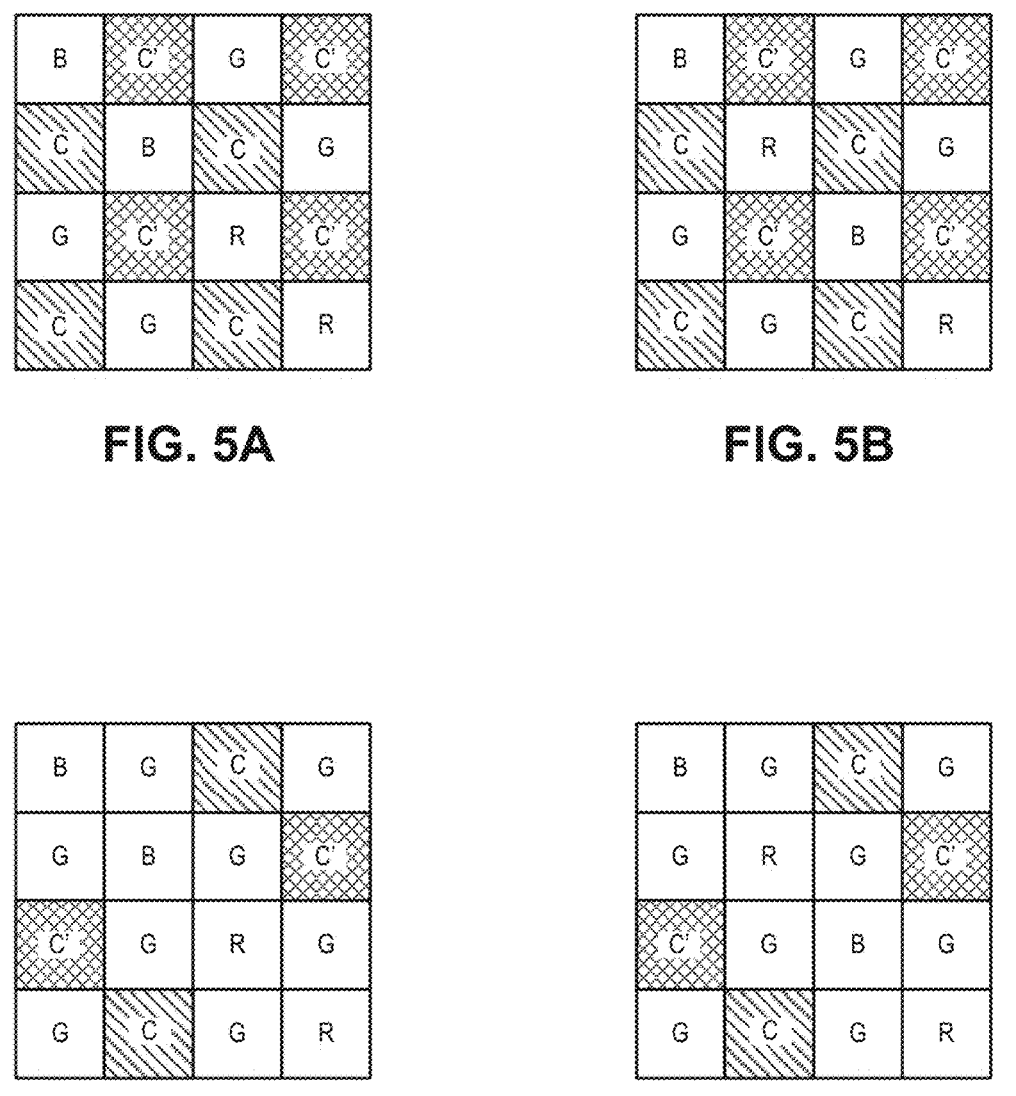

FIGS. 5A-5D are diagrams of example repeating patterns that include a four (4) by four (4) arrangement of image sensor pixels, in accordance with embodiments of the present disclosure. The patterns of FIGS. 5A and 5B each include about half of the total image sensor pixels included in the pattern as a combination of clear (C) and modified clear (C') image sensor pixels. For example, the patterns of FIGS. 5A and 5B each include sixteen total pixels, with four clear and four modified clear pixels for a combined total of clear and modified clear pixels of 8 (i.e., ½ of sixteen). Also, the patterns of FIGS. 5A and 5B include an equal number of clear pixels (i.e., 4) as there are modified clear pixels (i.e., 4). The patterns of FIGS. 5A and 5B illustrate clear and modified clear pixels arranged in a checkerboard pattern, where the pattern alternates between clear and modified clear pixels on each diagonal.

The patterns of FIGS. 5C and 5D include about one-quarter of the total image sensor pixels included in the pattern as a combination of clear (C) and modified clear (C') image sensor pixels. For example, the patterns of FIGS. 5C and 5D each include sixteen total pixels, with two clear and two modified clear pixels for a combined total of clear and modified clear pixels of 4 (i.e., ¼ of sixteen). Also, the patterns of FIGS. 5C and 5D include an equal number of clear pixels (i.e., 2) as there are modified clear pixels (i.e., 2). The patterns of FIGS. 5C and 5D illustrate clear and modified clear pixels arranged on at least some of the diagonals of the pattern, where the pattern alternates between clear and modified clear pixels.

Figure 6A:
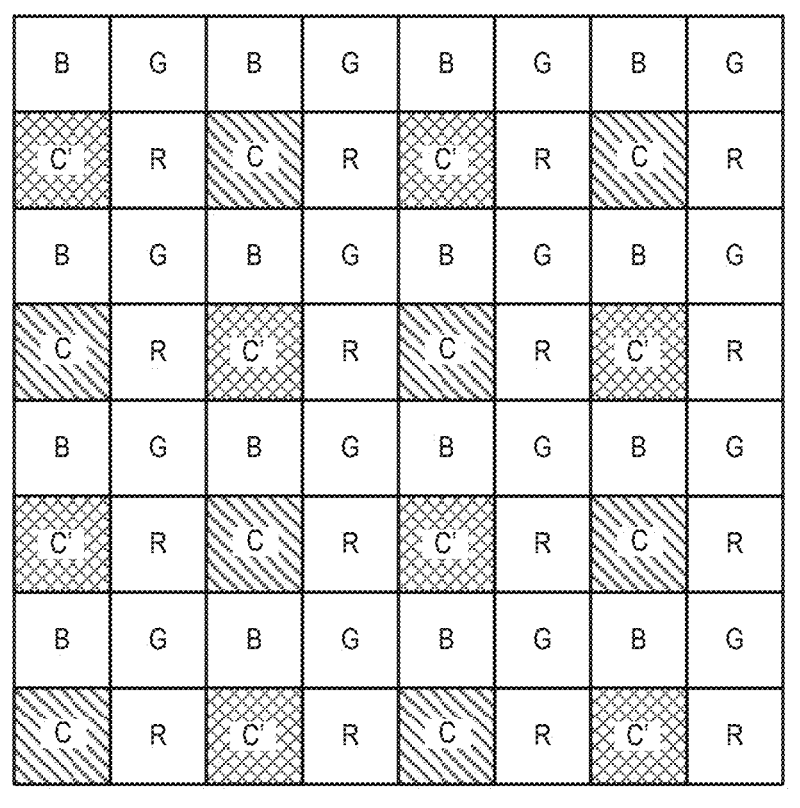

FIGS. 6A-8F are diagrams of example repeating patterns that include an eight (8) by eight (8) arrangement of image sensor pixels, in accordance with embodiments of the present disclosure. The patterns of FIGS. 6A and 6B each include about one-quarter of the total image sensor pixels included in the pattern as a combination of clear (C) and modified clear (C') image sensor pixels. For example, the patterns of FIGS. 6A and 6B each include sixty-four total pixels, with eight clear and eight modified clear pixels for a combined total of clear and modified clear pixels of 16 (i.e., ¼ of sixty-four). Also, the patterns of FIGS. 6A and 6B include an equal number of clear pixels (i.e., 8) as there are modified clear pixels (i.e., 8). The pattern of FIG. 6A illustrates the alternating between clear and modified clear pixels on each row that includes clear or modified clear pixels. The pattern of FIG. 6B illustrates the grouping of two consecutive clear and consecutive modified clear pixels on each row that includes clear or modified clear pixels.

Figure 6C:
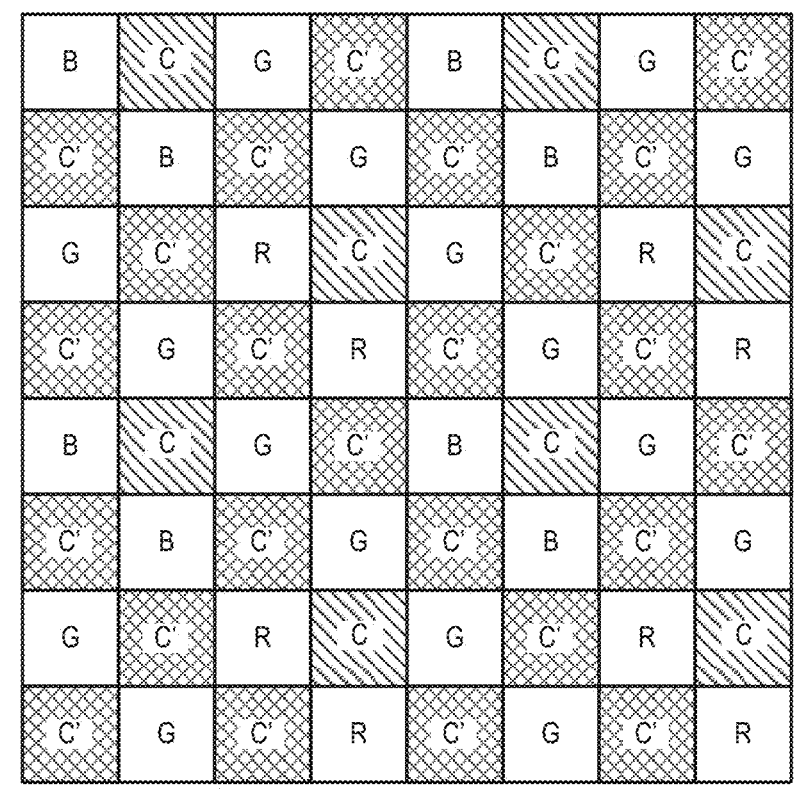
Figure 6D:
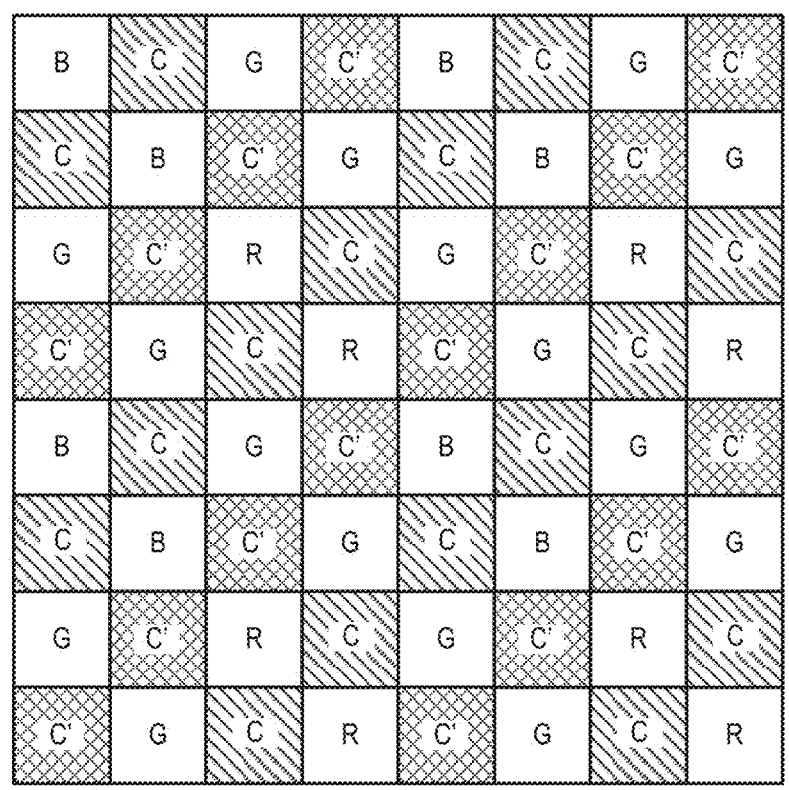

The patterns of FIGS. 6C and 6D each include about one-half of the total image sensor pixels included in the pattern as a combination of clear (C) and modified clear (C') image sensor pixels. For example, the patterns of FIGS. 6C and 6D each include sixty-four total pixels, with combined total of clear and modified clear pixels of thirty-two (i.e., ½ of sixty-four). Also, the pattern of FIG. 6D includes an equal number of clear pixels (i.e., 16) as there are modified clear pixels (i.e., 16). However, the pattern of FIG. 6C includes an unequal number of clear pixels (i.e., 8) as there are modified clear pixels (i.e., 24).

FIG. 7A illustrates a repeating pattern that also includes an eight by eight arrangement of image sensor pixels. The illustrated pattern of 7A includes four clear image sensor pixels and ten modified clear image sensor pixels arranged within the pattern as follows:

|  |  |  |  |  |  |  |  |
|---|---|---|---|---|---|---|---|
|  | C' |  |  |  |  | C' |  |
|  |  | C' | C' |  |  |  |  |
| C |  |  |  |  | C |  |  |
|  |  | C' | C' |  |  |  |  |
| C |  |  |  |  | C |  |  |
|  |  |  |  |  |  |  |  |
|  | C' | C' |  | C' | C' |  |  |
|  |  |  |  |  |  |  |  |

FIGS. 7B and 7C illustrate a repeating pattern that also includes an eight by eight arrangement of image sensor pixels. The illustrated patterns of 7B and 7C includes two clear image sensor pixels and sixteen modified clear image sensor pixels arranged within the pattern as follows:

|  |  | C' |  | C' |  |  |  |
|---|---|---|---|---|---|---|---|
|  |  |  | C' |  | C' |  |  |
| C' |  |  |  |  |  | C' |  |
|  | C' |  |  | C |  |  | C' |
| C' |  |  | C |  |  | C' |  |
|  | C' |  |  |  |  |  | C' |
|  |  | C' | C' |  |  |  |  |
|  |  |  | C' |  | C' |  |  |

Figure 7D:
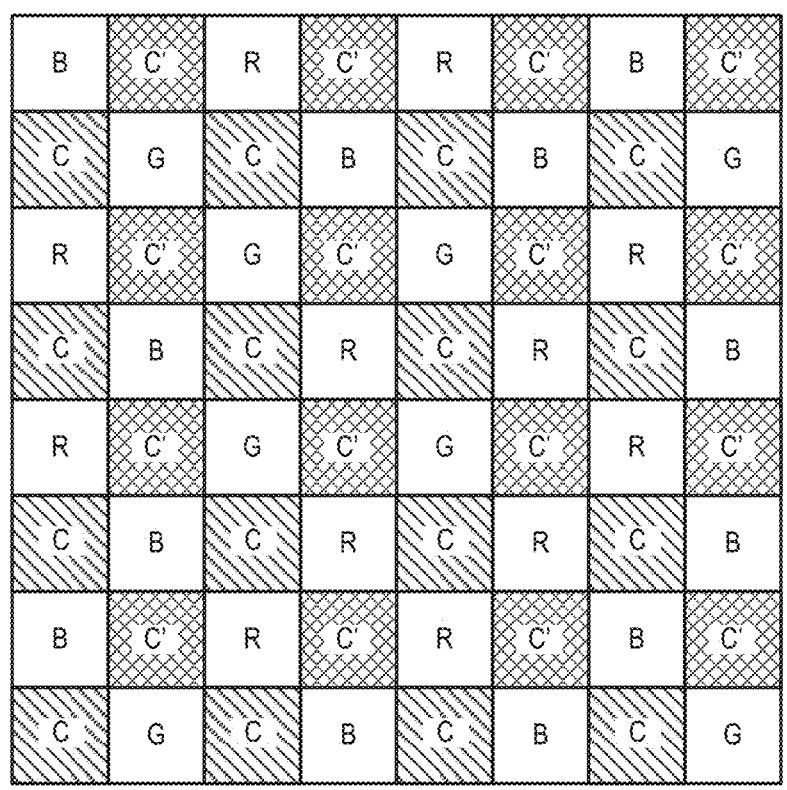
Figure 7E:
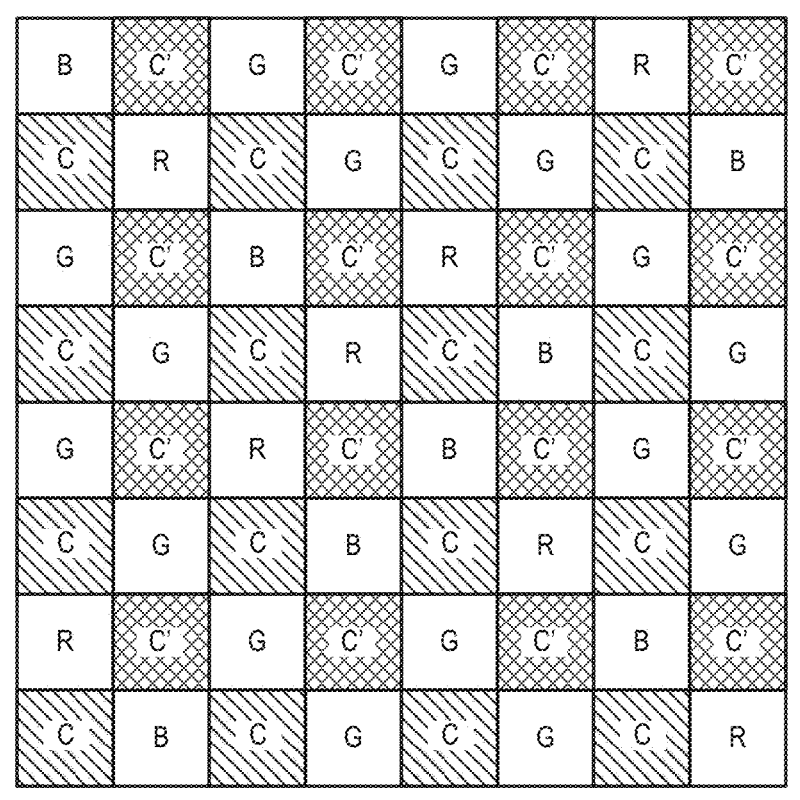

The patterns of FIGS. 7D-7F each include about one-half of the total image sensor pixels included in the pattern as a combination of clear (C) and modified clear (C') image sensor pixels. For example, the patterns of FIGS. 7D-7F each include sixty-four total pixels, with combined total of clear and modified clear pixels of thirty-two (i.e., ½ of sixty-four). Also, the patterns of FIGS. 7D-7F include an equal number of clear pixels (i.e., 16) as there are modified clear pixels (i.e., 16). The patterns of FIGS. 7D-7F illustrate clear and modified clear pixels arranged on each of the diagonals of the pattern, where the pattern alternates between clear and modified clear pixels along the diagonals.

FIG. 8A illustrates a repeating pattern that includes an eight by eight arrangement of image sensor pixels. The illustrated pattern of FIG. 8A includes an equal number of clear image sensor pixels (i.e., 4) as there are modified clear image sensor pixels (i.e., 4) arranged within the pattern as follows:

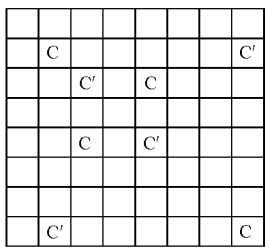

Figure 8B:
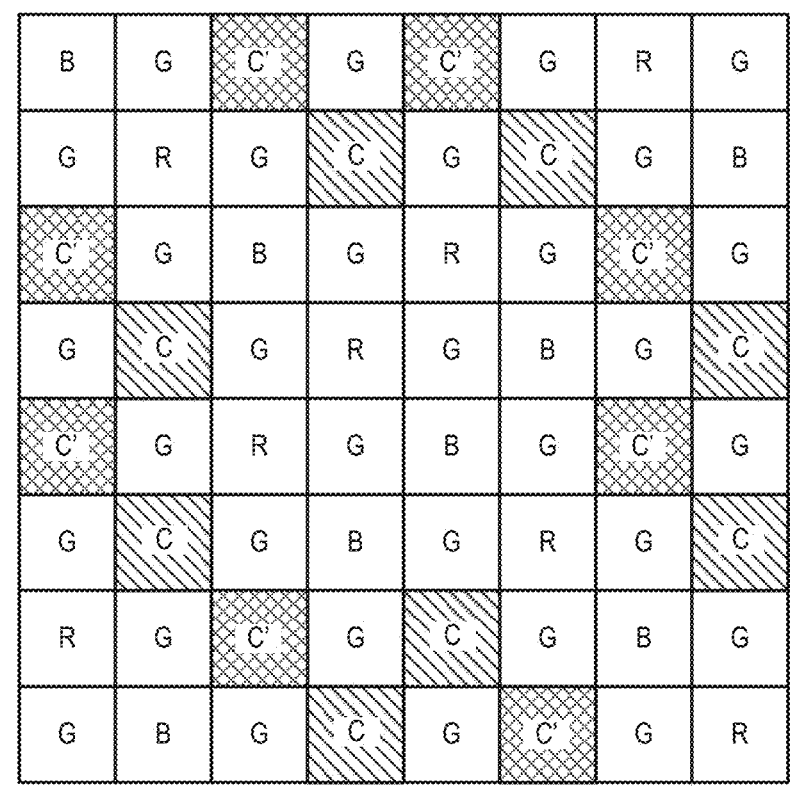
Figure 8C:
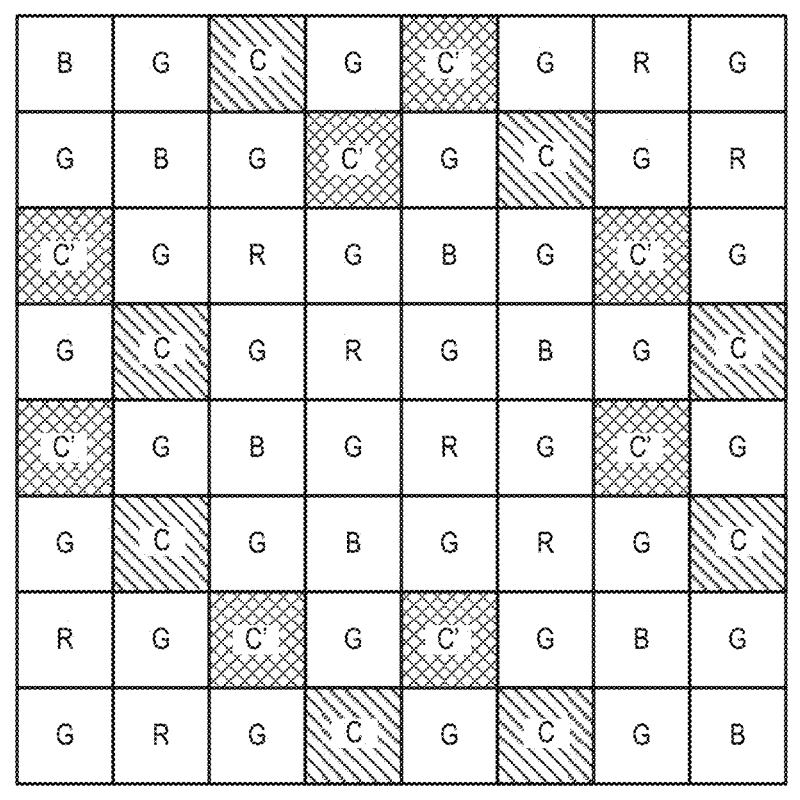

FIGS. 8B and 8C are diagrams of example repeating patterns that include an eight (8) by eight (8) arrangement of image sensor pixels, in accordance with embodiments of the present disclosure. The patterns of FIGS. 8B and 8C each include about one-quarter of the total image sensor pixels included in the pattern as a combination of clear (C) and modified clear (C') image sensor pixels. For example, the patterns of FIGS. 8B and 8C each include sixty-four total pixels, with eight clear and eight modified clear pixels for a combined total of clear and modified clear pixels of 16 (i.e., ¼ of sixty-four). Also, the patterns of FIGS. 8B and 8C include an equal number of clear pixels (i.e., 8) as there are modified clear pixels (i.e., 8). The patterns of FIGS. 8B and 8C include diagonal groupings of one clear image sensor pixel and one modified clear image sensor pixel distributed through the pattern, as shown.

Figure 8D:
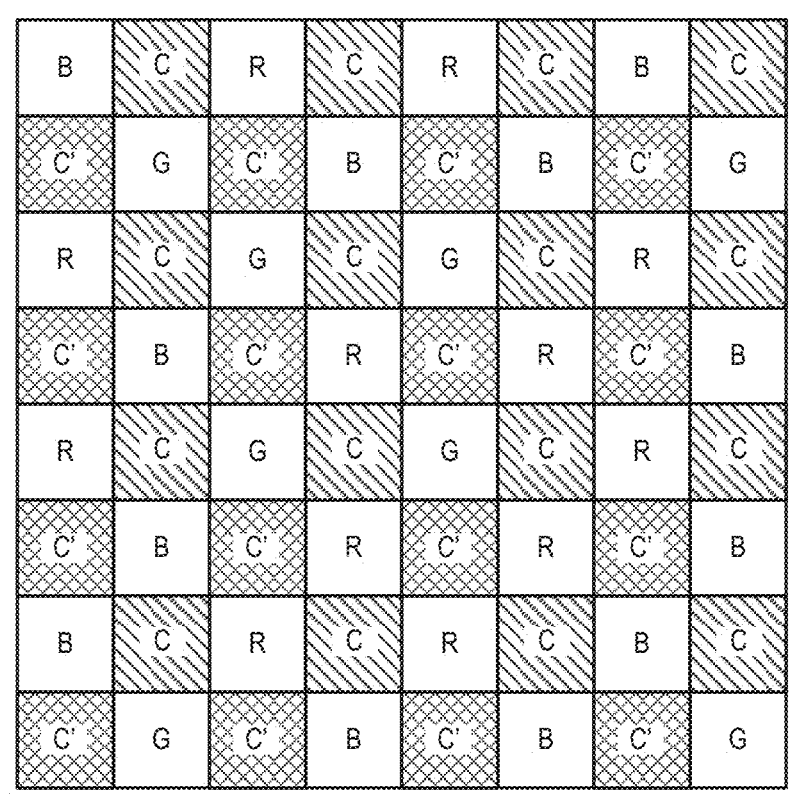
Figure 8E:
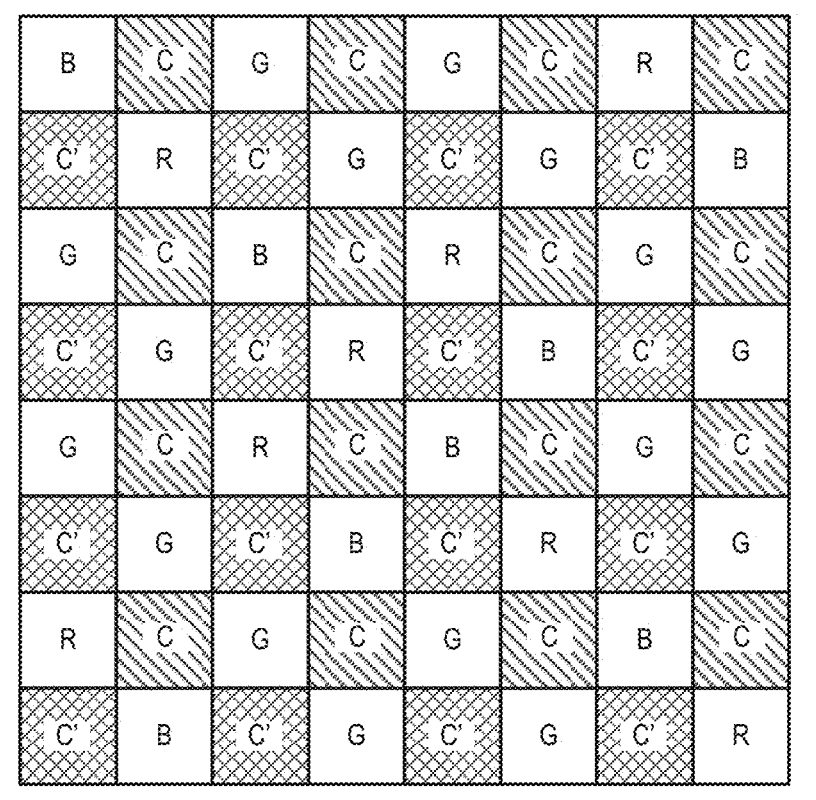
Figure 8F:
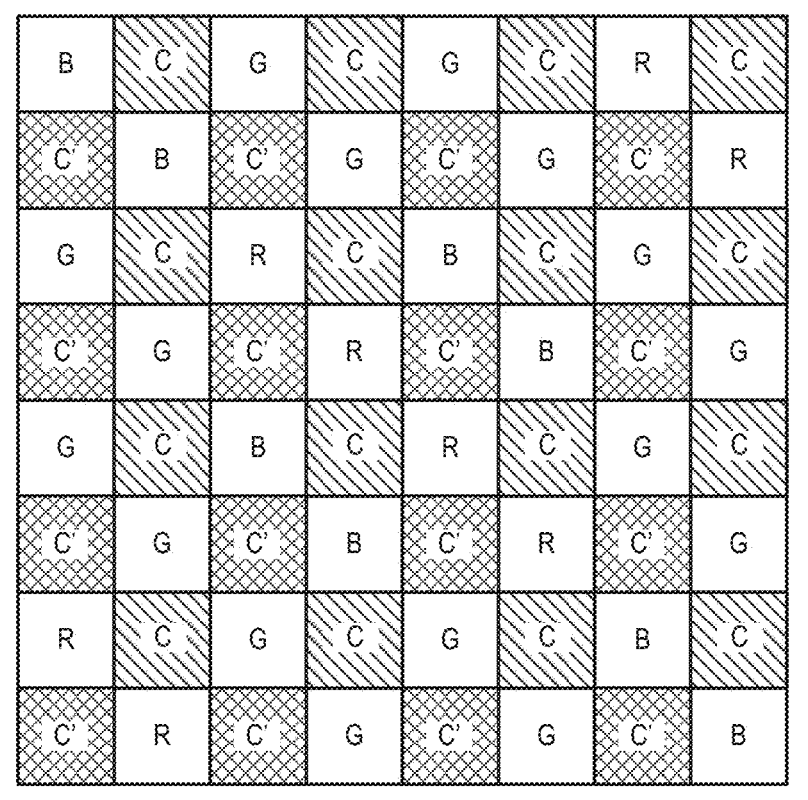

The patterns of FIGS. 8D-8F each include about one-half of the total image sensor pixels included in the pattern as a combination of clear (C) and modified clear (C') image sensor pixels. For example, the patterns of FIGS. 8D-8F each include sixty-four total pixels, with combined total of clear and modified clear pixels of thirty-two (i.e., ½ of sixty-four). Also, the patterns of FIGS. 8D-8F include an equal number of clear pixels (i.e., 16) as there are modified clear pixels (i.e., 16). The patterns of FIGS. 8D-8F illustrate clear and modified clear pixels arranged in a checkerboard pattern, where the pattern alternates between clear and modified clear pixels on each diagonal.

Figures 9A, 9B:
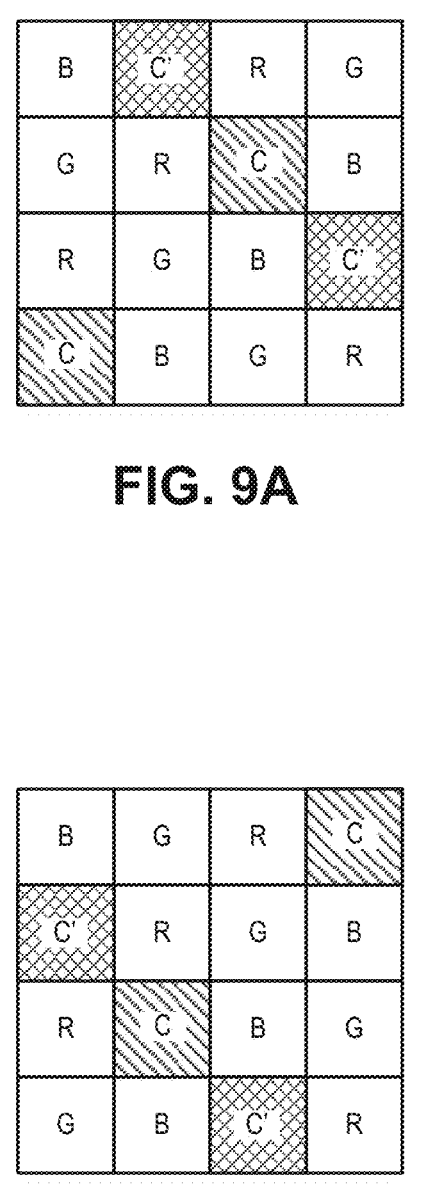

FIGS. 9A and 9B are diagrams of example repeating patterns that include a four (4) by four (4) arrangement of image sensor pixels, in accordance with embodiments of the present disclosure. The patterns of FIGS. 9A and 9B include about one-quarter of the total image sensor pixels included in the pattern as a combination of clear (C) and modified clear (C') image sensor pixels. For example, the patterns of FIGS. 9A and 9B each include sixteen total pixels, with two clear and two modified clear pixels for a combined total of clear and modified clear pixels of 4 (i.e., ¼ of sixteen). Also, the patterns of FIGS. 9A and 9B include an equal number of clear pixels (i.e., 2) as there are modified clear pixels (i.e., 2).

The above description of illustrated embodiments of the invention, including what is described in the Abstract, is not intended to be exhaustive or to limit the embodiments to the precise forms disclosed. While specific embodiments are described herein for illustrative purposes, various modifications are possible within the scope, as those skilled in the relevant art will recognize. These modifications can be made in light of the above detailed description. Examples of some such modifications include dopant concentration, layer thicknesses, and the like. Further, although the embodiments illustrated herein refer to CMOS sensors using backside illumination, it will be appreciated that they may also be applicable to CMOS sensors using frontside illumination.

The terms used in the following claims should not be construed to limit the invention to the specific embodiments disclosed in the specification. Rather, the scope is to be determined entirely by the following claims, which are to be construed in accordance with established doctrines of claim interpretation.

What is claimed is:

1. An image sensor pixel, comprising:
a semiconductor layer having a front surface and a back surface; and
a photodiode region formed in the semiconductor layer to receive visible and infrared light from a light incident side of the image sensor pixel;
a pinning layer formed in the semiconductor layer between the front surface and the photodiode region; and
a depletion adjustment layer disposed in the semiconductor layer between the pinning layer and the photodiode region, wherein the depletion adjustment layer is as wide as the pinning layer to adjust a depletion region of the photodiode region to reduce charge carriers induced in the photodiode region by the received infrared light.

2. The image sensor pixel of claim 1, wherein the depletion adjustment layer is configured to decrease a width of the depletion region as measured from a top of the depletion region to a bottom of the depletion region.

3. The image sensor pixel of claim 1, further comprising a depletion adjustment bias contact coupled to the pinning layer on the front surface of the semiconductor layer to further adjust the depletion region.

4. The image sensor pixel of claim 1, wherein the semiconductor layer is a p-type semiconductor layer, the photodiode region is an n-type photodiode region, the pinning layer is a p-type pinning layer; and the depletion adjustment layer is a p-type depletion adjustment layer.

5. The image sensor pixel of claim 1, further comprising a color filter disposed on the light incident side of the image sensor pixel.

6. The image sensor pixel of claim 5, wherein the color filter is a clear color filter configured to pass through light of more than one frequency range.

7. An image sensor comprising:
a complementary metal-oxide-semiconductor ("CMOS") array of image sensor pixels disposed in a semiconductor layer having a front surface and a back surface;
a first image sensor pixel of the array, including:
a first photodiode region formed in the semiconductor layer to receive visible and infrared light from a light incident side of the image sensor;

a first pinning layer formed in the semiconductor layer between the front surface and the first photodiode region; and a first depletion adjustment layer disposed in the semiconductor layer between the first pinning layer and the first photodiode region, wherein the first depletion adjustment layer is as wide as the first pinning layer to adjust a first depletion region of the first photodiode region to reduce charge carriers induced in the first photodiode region by the received infrared light; and a second image sensor pixel of the array, including:
a second photodiode region formed in the semiconductor layer to receive visible and infrared light from the light incident side of the image sensor; and a second pinning layer formed in the semiconductor layer between the front surface and the second photodiode region, wherein the second image sensor pixel includes no depletion adjustment layer disposed between the second pinning layer and the second photodiode region, such that charge carriers induced in the second photodiode region by the received infrared light are not reduced by a depletion adjustment layer.

8. The image sensor of claim 7, wherein the first depletion adjustment layer is configured to decrease a width of the first depletion region as measured from a top of the first depletion region to a bottom of the first depletion region.

9. The image sensor of claim 8, wherein the width of the first depletion region is less than a width of the second depletion region.

10. The image sensor of claim 7, wherein the first image sensor pixel further comprising a first depletion adjustment bias contact coupled to the first pinning layer on the front surface of the semiconductor layer to further adjust the first depletion region.

11. The image sensor of claim 7, wherein the semiconductor layer is a p-type semiconductor layer, the first and second photodiode regions are n-type photodiode regions, the first and second pinning layers are p-type pinning layers; and the first depletion adjustment layer is a p-type depletion adjustment layer.

12. The image sensor of claim 7, wherein the first image sensor pixel includes a first clear color filter disposed on the light incident side of the image sensor, and wherein the second image sensor pixel includes a second clear color filter disposed on the light incident side of the image sensor.

13. The image sensor of claim 12, further comprising readout circuitry for reading out pixel signals from each of the image sensor pixels of the array, wherein the readout circuitry is configured to produce an infrared signal value by subtracting a first pixel signal received from the first image sensor pixel from a second pixel signal received from the second image sensor pixel.

14. An image sensor comprising:
a complementary metal-oxide-semiconductor ("CMOS") array of image sensor pixels disposed in a semiconductor layer having a front surface and a back surface, wherein the array of image sensor pixels includes modified red (R) image sensor pixels, modified blue (B) image sensor pixels, modified green (G) image sensor pixels, modified clear (C') image sensor pixels, and clear (C) image sensor pixels, wherein each of the R, G, B, and C' image sensor pixels include:
a first photodiode region formed in the semiconductor layer to receive visible and infrared light from a light incident side of the image sensor;
a first pinning layer formed in the semiconductor layer between the front surface and the first photodiode region; and a first depletion adjustment layer disposed in the semiconductor layer between the first pinning layer and the first photodiode region to adjust a first depletion region of the first photodiode region, wherein the first depletion adjustment layer is as wide as the first pinning layer to reduce charge carriers induced in the first photodiode region by the received infrared light, and wherein each of the clear (C) image sensor pixels include:

a second photodiode region formed in the semiconductor layer to receive visible and infrared light from the light incident side of the image sensor; and a second pinning layer formed in the semiconductor layer between the front surface and the second photodiode region, wherein the clear image sensor pixels include no depletion adjustment layer disposed between the second pinning layer and the second photodiode region, such that charge carriers induced in the second photodiode region by the received infrared light are not reduced by a depletion adjustment layer.

15. The image sensor of claim 14, wherein the first depletion adjustment layer is configured to decrease a width of the first depletion region as measured from a top of the first depletion region to a bottom of the first depletion region.

16. The image sensor of claim 15, wherein the width of the first depletion regions is less than a width of the second depletion regions.

17. The image sensor of claim 14, wherein each of the R, G, B, and C' image sensor pixels further comprise a first depletion adjustment bias contact coupled to the first pinning layer on the front surface of the semiconductor layer to further adjust the first depletion region.

18. The image sensor of claim 14, wherein the semiconductor layer is a p-type semiconductor layer, the first and second photodiode regions are n-type photodiode regions, the first and second pinning layers are p-type pinning layers; and the first depletion adjustment layer is a p-type depletion adjustment layer.

19. The image sensor of claim 14, further comprising readout circuitry for reading out pixel signals from each of the image sensor pixels of the array, wherein the readout circuitry is configured to produce an infrared signal value by subtracting a pixel signal received from a modified clear (C') image sensor pixel from a pixel signal received from a clear (C) image sensor pixel.

20. The image sensor of claim 14, wherein the R, G, B, C, and C' image sensor pixels are arranged in the array according to a repeating pattern.

21. The image sensor of claim 20, wherein the repeating pattern includes about half of the image sensor pixels included in the pattern as a combination of clear (C) and modified clear (C') image sensor pixels.

22. The image sensor of claim 21, wherein the combination of clear (C) and modified clear (C') image sensor pixels includes a substantially equal number of clear (C) image sensor pixels as modified clear (C') image sensor pixels.

23. The image sensor of claim 20, wherein the repeating pattern includes about one-fourth of the image sensor pixels included in the pattern as a combination of clear (C) and modified clear (C') image sensor pixels.

24. The image sensor of claim 23, wherein the combination of clear (C) and modified clear (C') image sensor pixels includes a substantially equal number of clear (C) image sensor pixels as modified clear (C') image sensor pixels.

25. The image sensor of claim 20, wherein the repeating pattern includes an eight (8) by eight (8) arrangement of image sensor pixels, and wherein the clear (C) and modified clear (C') image sensor pixels are arranged within the pattern as:

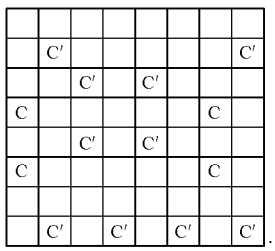

26. The image sensor of claim 20, wherein the repeating pattern includes an eight (8) by eight (8) arrangement of image sensor pixels, and wherein the clear (C) and modified clear (C') image sensor pixels are arranged within the pattern as:

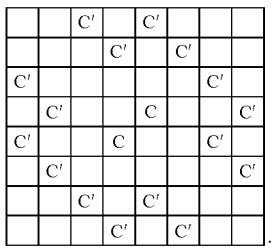

27. The image sensor of claim 20, wherein the repeating pattern includes an eight (8) by eight (8) arrangement of image sensor pixels, and wherein the clear (C) and modified clear (C') image sensor pixels are arranged within the pattern as:

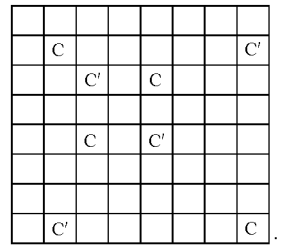

* * * * *